United States Patent [19]

Czubatyj et al.

[11] Patent Number: 4,882,295

[45] Date of Patent: Nov. 21, 1989

[54] METHOD OF MAKING A DOUBLE INJECTION FIELD EFFECT TRANSISTOR

[75] Inventors: Wolodymyr Czubatyj, Warren; Michael G. Hack, Clawson, both of Mich.; Michael Shur, Golden Valley, Minn.

[73] Assignee: Energy Conversion Devices, Inc., Troy, Mich.

[21] Appl. No.: 328,666

[22] Filed: Mar. 27, 1989

Related U.S. Application Data

[60] Division of Ser. No. 852,686, Apr. 16, 1986, which is a continuation-in-part of Ser. No. 788,594, Oct. 17, 1985, abandoned, which is a continuation-in-part of Ser. No. 759,634, Jul. 26, 1985, abandoned.

[51] Int. Cl.$^4$ ............................................. H01L 29/78
[52] U.S. Cl. ...................................... 437/101; 437/46; 437/228; 437/944; 437/964; 148/DIG. 1; 148/DIG. 105; 357/23.7
[58] Field of Search ................... 437/46, 101, 40, 944, 437/962, 233, 228; 148/DIG. 1, 105; 357/2, 23.7

[56] References Cited

U.S. PATENT DOCUMENTS

| | | | |
|---|---|---|---|
| 3,333,115 | 7/1967 | Kawakami | 357/23.4 |
| 3,544,864 | 12/1970 | Richman | 357/23.1 |
| 4,425,572 | 1/1984 | Takluji et al. | 357/23.7 |
| 4,458,261 | 7/1984 | Omura | 357/23.7 |
| 4,605,941 | 8/1986 | Oushinsley et al. | 357/2 |
| 4,646,424 | 3/1987 | Parks et al. | 347/23.7 |
| 4,720,736 | 1/1988 | Takaluji et al. | 357/23.7 |
| 4,797,108 | 1/1989 | Crowther | 148/DIG. 1 |

FOREIGN PATENT DOCUMENTS

| | | |
|---|---|---|
| 0090661 | 10/1983 | European Pat. Off. |
| 0183770 | 9/1985 | Japan ................... 357/23.7 |

OTHER PUBLICATIONS

Masakiyo Matsumura, "Amorphous Silicon Transistors and Integrated Circuits", Japanese J. of Applied Physics, Vol. 22 (1983), supplement 22-1, pp. 487–491.

Primary Examiner—Brian E. Hearn
Assistant Examiner—T. Thomas
Attorney, Agent, or Firm—Richard M. Goldman; Marvin S. Siskind; Kenneth M. Massaroni

[57] ABSTRACT

Double injection field effect transistors, which may be horizontally or vertically arranged, each include a body of semiconductor material extending between two current-carrying electrodes and forming a current path therebetween. The semiconductor body of each may be substantially intrinsic or lightly doped. One or more control electrodes or gates located adjacent to each current path project a variable electric field over the ambipolar path, which modulates current by controlling the amount of charge carriers of both polarities injected into the semiconductor body. In most of the single gate embodiments, the electrodes extend across a portion, preferably a major portion such as 75% or 90%, or the length of the current path, but not the entire length of the current path. The embodiments having a plurality of gates typically have two insulated gates, one extending from the anode electrode and the other extending from the cathode electrode. The gates in a single device may overlap.

Embodiments having electrodes with doped microcrystalline regions for improved carrier injection are disclosed. Methods for making planar double injection field effect transistors having a plurality of deposited noncrystalline semiconductor layers for clean interface formation between semiconductor layers are also disclosed.

2 Claims, 6 Drawing Sheets

METHOD OF MAKING A DOUBLE INJECTION FIELD EFFECT TRANSISTOR

CROSS REFERENCE TO RELATED APPLICATIONS

This is a division of application Ser. No. 852,686, filed Apr. 16, 1986, which is a continuation-in-part of U.S. patent application Ser. No. 788,594 filed Oct. 17, 1985 and entitled "Double Injection Field Effect Transistors", now abandoned, which is a continuation in part of U.S. patent application Ser. No. 759,634 filed July 26, 1985 and entitled "Vertical Modulated Injection Transistor And Method For Making The Same" now abandoned.

FIELD OF THE INVENTION

The present invention relates generally to semiconductor structures for analog or digital applications which have ambipolar or unipolar current modulated by electric fields produced due to a voltage applied to a control electrode, and more particularly to two classes of field effect transistor structures which may be called double injection field effect transistors (DIFETs), and vertical modulated injection transistors (VMITs). Both DIFETs and VMITs have an intrinsic or doped semiconductor region or body located between two or more current-carrying electrodes and at least one gate or control electrode located adjacent to or within the intrinsic or doped semiconductor region for modulating or switching the ambipolar or unipolar current flowing between such current-carrying electrodes by voltage applied to the gate electrode.

INTRODUCTION TO THE INVENTION

The aforementioned copending patent applications disclose in considerable detail two classes of field effect transistor (FET) structures which are particularly suited for integrated thin film transistor devices made from deposited amorphous, microcrystalline, or polycrystalline semiconductor materials. A number of these FET structures may also be replicated in various forms in monocrystalline transistor structures, made of silicon or gallium arsenide for example, using known techniques such as molecular beam epitaxy. The introductory discussion which follows briefly summarizes a number of more important distinguishing characteristics of the double injection field effect transistors. Although a number of junction field effect devices are described in the aforementioned copending patent applications, most preferred embodiments of the DIFETs utilize insulated gates in order to have truly high input impedance control electrodes, which are typically used to induce charge carriers of both polarities into the channel. Accordingly, the following introductory discussion shall focus upon these insulated gate DIFETs. Also, to avoid undue length, the introductory discussion and the illustrative examples of the present invention disclosed hereinafter shall primarily address horizontally arranged FET structures, but those in the art should appreciate the applicability of our disclosures herein to vertically arranged FET structures, like our VMITs disclosed in our copending applications.

Most semiconductor devices existing today are either field effect transistors (FETs) or bipolar junction transistors (BJTs). Field effect transistors are essentially unipolar devices based on a capacitive coupling between the gate and the channel. The capacitively induced (or depleted) charge directly adds to (or deducts from) the channel conductance.

By contrast, we have disclosed in the above-identified copending applications, a device we call the double injection FET (DIFET) which uses the capacitive modulation of the quasi-neutral plasma of electrons and holes created in a semiconductor by double injection. Such a quasi-neutral plasma may also be created by absorption of external radiation, or by thermal generation in an intrinsic narrow gap semiconductor. The double injection of carriers is the most appropriate way to realize such a plasma for general use, and for amorphous silicon alloys, this has been described in M. Hack and W. denBoer, "A Comparison of Single- and Double-Carrier Injection In Amorphous Silicon Alloys", Journal of Applied Physics, Vol. 58, pp. 1554–1561 (1985). The DIFET device summarized here, and schematically shown in FIG. 1, utilizes the modulation of the double injected plasma by the gate, as do the new embodiments of the invention which are described thereafter.

In a DIFET, the capacitively induced charge, in the conducting channel, leads to an increased plasma density so as to maintain plasma quasi-neutrality. In contrast to a conventional field effect transistor, the charge densities of both electrons and holes induced into the channel may be much larger than the total net induced charge. This leads to a greatly increased transconductance.

This new general principle can be applied to both crystalline and amorphous materials; however, in amorphous materials, it leads to additional important advantages. In such materials, the conventional energy gap in crystalline semiconductors is replaced by a mobility gap separating localized from delocalized band-like states. In the conventional regime of operation of an amorphous semiconductor FET, most of the induced charge goes into the localized states and only a small fraction into the conducting delocalized states. This results in a very small field effect mobility of the order of 1 cm$^2$/Vs in typical state-of-the-art a-Si FET transistors made with amorphous silicon alloys. This principle is illustrated by FIG. 2 showing a one dimensional simulation of the free carrier concentrations across the channel of an amorphous silicon alloy device of the type shown in FIG. 1 for both a one carrier and two carrier system. At the semiconductor-insulator interface, the Fermi level (or quasi-Fermi level in the DIFET case) is 50 meV from the conduction band edge. Away from the interface, in the DIFET case, we have put both the electron and hole concentrations at about $10^{15}$ cm$^{-3}$, to simulate their values in a highly forward biased p-i-n diode. As can be seen in the two carrier system, the concentrations of both carriers increases very significantly towards the interface as a result of the band bending at this surface. This simulation is based on a simultaneous solution of the transport equations for amorphous silicon as described in M. Hack and M. Shur, "Physics of Amorphous Silicon Alloy p-i-n Solar Cells", Journal of Applied Physics, Vol. 58, pp. 997–1020 (1985).

The importance of modulating the concentration in the channel of both types of carriers is that the gate field now acts on the space-charge arising from the *difference* in the number of positive and negative charges in the active layer, whereas the conductance of this regions depends on the *sum* of the number of mobile carriers. Hence, for any given gate field, much higher channel conductances can be obtained in a two carrier system than in a conventional FET. This advantage can also be seen in comparing the current-voltage characteristics of double injection p-i-n diodes with single injection n-i-n devices. In the aforementioned journal article by M. Hack and W. denBoer it was shown that for amorphous silicon alloy diodes, at high forward bias, orders of magnitude more current can be obtained from p-i-n devices than from n-i-n diodes. Moreover, as can be seen from FIG. 1, the effective channel depth in a two carrier system (defined for instance as the depth in which ninety percent of the current flows) may be, for example, approximately twenty times greater than for a single carrier system, as a result of the tendency towards space charge neutrality. This will also increase the current carrying capacity and transconductance of a device resulting in unique power handling capabilities. Since the additional delays related to the parasitic capacitances are greatly reduced (these delays are proportional to $C_p/I$ where $C_p$ is the parasitic capacitance, and I is the current), these new devices will allow for faster switching There is a further advantage in using a two carrier system for amorphous semiconductor devices. The localized states in the mobility gap have an occupation function of less than unity between the trap quasi-Fermi levels when both carriers are present as compared to unity in a single carrier structure. Consequently, the carrier quasi-Fermi levels in the two carrier systems will move closer to the band edges for any given induced gate charge. This is, in effect, one reason for amorphous silicon p-i-n diodes having larger currents than the n-i-n diodes at forward voltages above the built-in potential. It also means that in amorphous systems, the effective field effect mobility of the dominant carrier will be higher in the two carrier systems, although as will be shown later, unlike conventional FETs, this effective field-effect mobility depends very strongly on both gate and anode-cathode (source-drain) voltage.

In practice, the electron-hole plasma in a DIFET should not exactly be neutral. Carriers of the same sign as the net mobile space charge (that is, the dominant carriers) will respond according to the sign of the gate field and the carriers of the second sign (that is, the compensating carriers) will adjust so as to preserve quasi-neutrality. This allows the construction of devices where the double injection current of the p-i-n diode is either considerably enhanced or depleted by the gate field. For maximum enhancement (desirable for high current, high speed performance) we disclosed that the gate must act substantially over the complete channel so that the concentration of both carriers can be controllably increased by orders of magnitude, thereby enhancing the conductance of the semiconductor region all the way from anode to cathode. For depletion mode operation, it is only necessary to reduce both carrier concentrations in one portion of the source-drain region and so the gate need not cover the whole of the channel. In this regard, the conductivity modulated field effect transistor (COMFET) is a device where the safe acts over a portion of the current path to control its flow into the base of a bipolar transistor. See, e.g., B.J. Baliga, et al., IEDM Technical Digest, p. 264 (1982); A. M. Goodman, et al. IEDM Technical Digest, p. 79 (1983). The DIFET, however, is the only device of which we are aware that operates in the enhancement mode of the type just described. This mode is a linear enhancement mode in that DIFETs do not have a negative resistance region like a thyristor does, and accordingly DIFETs will not latch on due to regenerative processes. Our new principle of modulating a two carrier system can be both applied to horizontal devices as well as to vertical devices, such as our VMITs.

FIG. 3 shows the measured low voltage anode-cathode current-voltage characteristics of an exemplary hydrogenated amorphous silicon alloy (a-Si:H) DIFET for having a channel length of 20 microns, a width of 1,000 microns, and a 2,000 angstrom thick silicon oxide gate insulator. It is interesting to note that for a conventional FET these characteristics would be ohmic around the origin, whereas the DIFET does not turn on until there is a significant amount of double injection into the intrinsic layer. This occurs at a anode-cathode voltage $V_{AK}$ comparable to the built-in potential (approximately 1.2 volts) of the a-Si:H p-i-n diode.

In FIG. 4A, we show the characteristics of the device shown in FIG. 3 at larger voltages. These curves are triadic and are characteristic of DIFET action in the enhancement mode under certain conditions In a conventional FET operating at a fixed gate voltage VG, as the source-drain voltage is increased, the channel current (indicated by the dashed line in FIG. 4A) saturates. In a DIFET by contrast, with increasing anode-cathode voltage, the channel current $I_{AK}$ rises very rapidly, partly because of increased double injection and partly because of the space charge profile within the channel. It may be noted that for a channel length of 20 microns, an anode-cathode voltage of 25 volts is about two orders of magnitude below that required to cause breakdown. Also superimposed on FIG. 4A as a dashed line are characteristics of an amorphous FET of similar geometry with a field-effect mobility of 0.5 cm$^2$/Vsec and a threshold voltage of 2 volts, operating with $V_G=20$ volts. For $V_{AK}=25$ volts, it can be seen that the measured DIFET current is approximately fourteen times that of a regular FET It is this high current capability that will enable transistors operating on these new physical principles to achieve high switching speeds.

FIG. 48 shows anode-cathode current versus gate voltage for an amorphous silicon alloy DIFET, wit $V_{AK}=25$ volts a channel width-to-length ratio of 50, and a gate insulator thickness of 2000 angstroms. As can be seen, at moderate voltages, we have obtained an output current of 2 mA. These characteristics are not quadratic at high gate voltages, but rise much faster than they would in a conventional FET. As explained above, due to the new physical principles, the concept of a bias independent field effect mobility is not appropriate to these new devices.

The active channel region is effectively an electron-hole plasma. The main anode-cathode current is a bulk recombination current. Hence, these new devices will turn off very quickly, and not be highly dependent on the removal of stored charge from the intrinsic regions, as in single carrier transistors. Moreover, the large concentrations of electrons and holes in the channel of an amorphous device will ensure a reasonable amount of radiative recombination resulting in optical emission. As has already been demonstrated in amorphous silicon p-i-n diodes (see, e.g., D. Kruangam, et al., Japanese Journal Applied Physics, Vol. 24, p L806 (1985)), the wavelength of this emission can be adjusted by changing the optical band gap of the intrinsic region by alloying the silicon with a suitable material. Hence, we can fabricate visible light emitting transistors whose emission can be frequency and/or amplitude modulated at high speeds. By designing an amorphous transistor in a suitable optical cavity, on account of the very high carrier concentrations in the channel, construction of a solid-state thin visible laser becomes a possibility. This ability of the DIFET to produce modulated optical emission will also apply to crystalline versions of this device, using appropriate band gap semiconductors. These devices should produce high frequency modulated optical output from very low power drive signals, as is disclosed in our copending U.S. patent application Ser. No. 788,594.

In light of the foregoing discussion, those in the art should appreciate that we have disclosed and demonstrated a new physical mechanism of operation for solid-state devices—the modulation of an electron-hole plasma under the influence of a gate field which extends substantially from anode to cathode. Using an amorphous silicon alloy thin film version of this transistor (DIFET), we have achieved currents of up to twenty times those theoretically possible from conventional single carrier amorphous silicon FETs operating under similar conditions. A new generation of amorphous, microcrystalline, polycrystalline and crystalline devices and integrated circuits based on this principle should find numerous applications in electronics and electro-optics.

The various embodiments of double injection field effect devices described above and in our aforementioned copending patent application are well suited to deliver high speed and high performance for a given semiconductor material or for a given system of compatible semiconductor materials deposited or otherwise formed into one or more solid-state devices. We believe that other configurations of ambipolar field effect devices which utilize our new principles of ambipolar operation are also possible. Some such configurations which we disclose herein will not deliver the maximum enhancement of current achievable by some of our earlier device configurations. Other such configurations having dual gates, however, may deliver as much or even more enhancement current than our previously disclosed single gate DIFET configurations. Accordingly, one of the primary purposes of this application is to describe various alternative configurations for our double injection field effect devices which we have invented. Another object of the present invention is to describe thin film DIFET devices which can be made by the continuous unbroken deposition of amorphous semiconductor alloys in multiple layers to ensure the formation of clean interfaces between layers in such devices. Another important objective of the present application is to disclose our current understanding of the new device physics employed in our double injection field effect transistors.

SUMMARY OF THE INVENTION

According to one embodiment of the invention a solid-state electronic device comprising first and second electrodes, a body of semiconductor material forming a current path between the first and second electrodes, means for ambipolar carrier injection into the current path in response to an externally applied voltage, and electric field means for exerting electric field is provided. The electric field means exerts and electric field along at least the majority of the length of the current path but less than the entire length of the current path to increase the ambipolar current flow in the current path. The exerted electric field is distinct from the electric field induced by the applied voltage.

A second embodiment of the invention is a solid-state electronic device comprising first and second electrodes, a body of semiconductor material forming a current path between the first and second electrodes, means for ambipolar carrier injection into the current path in response to an externally applied voltage, and electric field means for exerting an electric field along a portion of the length of the current path to enhance the ambipolar current flow in the current path. In this embodiment, the exerted electric field is also distinct from the electric field induced by the voltage applied by the ambipolar carrier injection means.

In both of the foregoing embodiments, the electric field means may include at least one control electrode adapted to receive an applied control voltage. The control electrode preferably extends along a portion of the length of and is in close proximity to the current path. In both embodiments, the first and second electrodes may comprise a cathode and anode respectively. The control electrode referred to above may extend toward the anode from a point in close proximity to the cathode or vice versa. In both embodiments, the electric field means may also comprise a pair of control electrodes, each adapted to receive an applied control voltage and each extending along a portion of the length of and being in close proximity to the current path. The two control electrodes may terminate in overlapping relation, or in non-overlapping relation.

The body of the semiconductor material may be single crystalline, polycrystalline, or amorphous. The semiconductor material of the body, which forms the active region or layer of the device, may be intrinsic or lightly doped. The first and second electrodes may include regions of doped semiconductor material, which may be microcrystalline, thereby improving carrier injection into said body.

Yet another aspect of the present invention is a method of forming a thin film electronic device. This method comprises the steps of: forming a conductive gate on an insulating substrate; forming an insulating layer over said gate; depositing a layer of substantially intrinsic noncrystalline semiconductor material over said insulating layer; and forming a layer of etchable metal over said doped layer and patterning said metal. The metal is to be etchable by an etchant which does not readily adversely affect the electronic properties of the layer during etching. The method further includes the step of depositing a first layer of doped noncrystalline semiconductor material over the patterned metal, and removing said metal layer by etching, and at the same time, removing that portion of the first doped layer which overlies the etchable metal layer. The method may further include the step of depositing a second doped layer after removing the etchable metal layer.

A third embodiment of the present invention is a solid-state electronic device comprising first and second electrodes, a body of semiconductor material forming a current path between the first and second electrodes, ambipolar carrier injection means of the type previously described, and electric field means of the type previously described. In this embodiment, the body of semiconductor material defines a layer with the first electrode being on one side of the layer, and the second electrode being on the opposite side of the layer. The first electrode includes a region of doped semiconductor material in electrical contact with the layer and extends along the layer for substantially the entire length of the current path. This region of doped semiconductor material of the first electrode preferably has a relatively low conductivity in the direction of the current path, i.e., along the length of the current path. It is preferably microcrystalline.

These and other aspects of the invention, along with other objects and advantages thereof, may be better understood by referring to the following description of the preferred embodiments of the present invention in conjunction with the figures of the drawings.

DETAILED DESCRIPTION OF THE PREFERRED EMBODIMENTS

Figure 5:
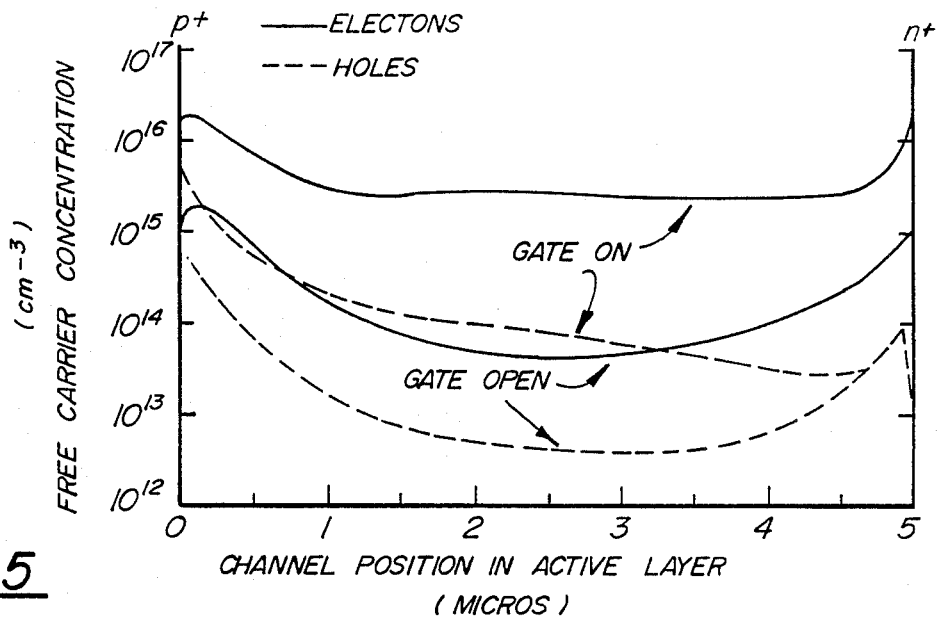
FIG. 5 is a graph of the results of a one dimensional computer simulation of the free carrier concentrations along the channel of a DIFET under a floating gate ("open gate") condition, and under a +10 volt applied gate bias condition.

Before discussing the several embodiments of the present invention, it is useful to present our current understanding of the physics behind the new principle of operation embodied in our double injection field effect transistors, namely the enhancement or amplification of a double injection current by a field applied to a gate electrode. This is illustrated by FIG. 5, which shows a one dimensional computer simulation of the free carrier concentrations in a five micron thick amorphous silicon alloy p-i-n diode at 8 volts forward bias, with the gate floating and with an applied bias of +10 volts. A full description of our computer simulation for amorphous silicon alloy devices in general is given in the aformentioned journal article by M. Hack and M. Shur. It is based on a self-consistent solution of the full set of transport equations incorporating Shockley-Read-Hall recombination kinetics at a continuous distribution of localized states in the mobility gap of these alloys. To model the action of the gate in our DIFET devices, we have modified Poisson's equation along the channel of the diode model used in our computer simulation, such that:

$$\rho(x) = q\left[ p(x) + p_t(x) - n_t(x) - n(x) + (1 - \alpha)\frac{C_G(V_G - V(x))}{qZ} \right] \quad (1)$$

where $\rho(x)$ is the fraction of the space charge density creating the electric field along the channel, $p_t(x)$ and $n_t(x)$ are the densities of trapped positive and negative charges respectively, $p(x)$ and $n(x)$ are the free positive and negative carrier distributions respectively, $C_G$ is the effective gate capacitance, $V_G$ is the gate potential, $V(x)$ is the channel potential, and $Z$ is the effective two carrier channel depth. Most of the gate charge, $(1-\alpha)C_G V_G$, will enter the channel so as to maintain a high electric field perpendicular to the channel, and as a first approximation, we assume that a small component of this charge, $\rho(x) \approx C_G V_G/Z$, will enter the channel so as to maintain a high electric field perpendicular to the channel, and as a first approximation, we assume that a small component of this charge, $\rho(x) \approx \alpha C_G V_g/Z$, increases the charge density along the channel where $\alpha$ is a constant less than unity.

As can be seen from FIG. 5, the application of a voltage to the gate enhances both the electron and hole concentrations throughout the channel except for the narrow accumulation regions near to the p+ and n+ contacts. This is because in double injection systems the resultant plasma density can be much larger than the injected or induced charge density (See, M. A. Lamperly and P. Mark, *Current Injection In Solids,* Academic Press, New York, p. 211 (1970)).

Additional insight to this phenomenon can be realized by considering the trapped charge densities in the channel and to the first approximation, the gain factor equals $\tau_p/t_p$ where $\tau_p$=hole lifetime and $t_p$=hole transit time.

Hence, for a sample length L, we may write $$qn_t \approx \frac{p}{t_p}\left(\frac{C_G V_G}{Z} + \frac{CV}{L}\right) + (1-\alpha)\frac{C_G V_G}{Z} \quad (2)$$

$$pq_t \approx qn_t - \frac{C_G V_G}{Z} \quad (3)$$

Short channel DIFETs have triodic characteristics as $qp_t$ is larger than $C_G V_G/Z$ and the gain factor $\tau_p/t_p$ increases with increasing anode-cathode voltage $V_{AK}$. It is this new mode of operation that causes the high current output of the DIFET. The portion of the charge induced into the channel by the gate is amplified by the double injection gain resulting in higher carrier concentrations than those possible in MOSFETs. For long channel DIFETs, the $C_G V_G/Z$ term in Equation (2) dominates. Thus, in such a device where $V_{AK} < V_G - V_{th}$ (where $V_{th}$ is the threshold voltage of the FET), the device behaves like a MOSFET, and the accumulation region forming the channel in the gate is heavily dominated by the majority carriers and operates as though it were substantially unipolar even though it is ambipolar. But when $V_{AK} > V_G - V_{th}$ this device now differs from a MOSFET in that the device current does not saturate. This is because the portion of the device near the anode where the gate potential is less than the channel potential minus the threshold voltage is a more closely balanced double injection system, and the length of this double injection portion will increase considerably with increasing $V_{AK}$. Thus, increasing $V_{AK}$ will reduce the effective channel length because the ambipolar accumulation region under the gate which operates as though it is substantially unipolar will diminish in length while the "balanced" double injection region under the gate increases in length, thereby increasing the output current.

In the figures, like parts of the various transistor structures are referred to by the same reference numerals. For convenience the reference numerals below 330 used in this application correspond to like parts bearing the same reference numerals in the transistor devices of our previously filed copending patent applications.

Figure 6:
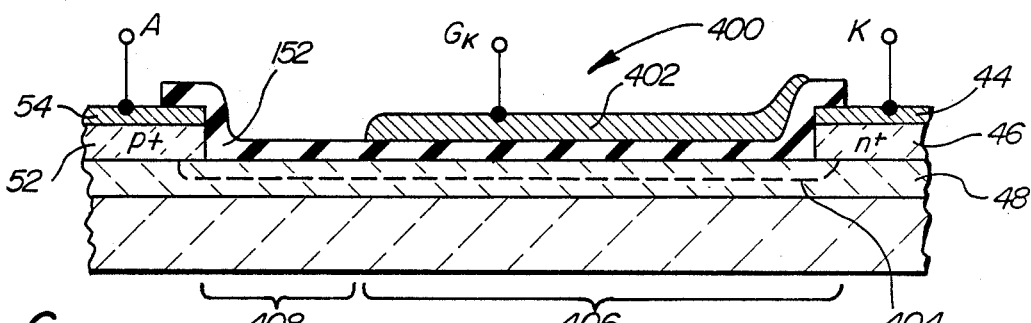
FIG. 6 is a fragmentary partial cross-sectional view of one embodiment of the DIFET of the present invention having a gate which may be called the cathode gate, that extends from the cathode across a substantial portion of, but not all of, the channel length

Referring now to FIG. 6, a horizontally arranged DIFET 400 of the present invention is shown DIFET 400 includes: an active semiconductor layer 48 on top of an insulating substrate 42; a current-carrying anode A which includes a p-type doped semiconductor layer 52 and a highly conductive, preferably metallic, electrode layer 54 which makes ohmic contact with layer 52; a cathode K which includes a n-type doped layer 46 and a highly conductive, preferably metallic, layer 44 which makes ohmic contact with layer 46, a gate insulator layer 152; and a "cathode" gate $G_K$ comprised of a highly conductive layer 50. The semiconductor layer 48 of the FIG. 5 device may be intrinsic or it may be lightly doped either n type or p type in a manner which does not drastically reduce the carrier lifetimes of the minority carrier. When layer 48 is made of amorphous alloys of silicon, such as hydrogenated amorphous silicon, with or without fluorine, and with or without other band-gap modifying elements, it is preferred, when doping layer 48, that n type dopants be used since the mobility of electrons in such material is several times that of holes in such material. In its substantially intrinsic state, amorphous alloys of silicon have a slightly n-type characteristic. The doped layers 46 and 52 of DIFET 400 are preferably heavily doped. Accordingly, they may be referred to as p+ type and n+ type layers, and will have a high conductivity of holes and electrons respectively. It is preferred that DIFET 400 be operated in the enhancement mode, wherein an electric potential is applied to the gate $G_K$ to induce an ambipolar current flow in the conduction channel portion 406 adjacent the insulating layer 152 between p+ layer 52 and n+ layer 46.

The double injection field effect devices of the present invention, such as DIFET 400, are preferably formed of materials which can be deposited as thin films upon substrate 42, which substrate can be formed on a wide variety of materials including glass. The highly conductive layers 44 and 46 are preferably made of metal, such as molybdenum, chrome, or aluminum, for example. The material of the gates such as the gate 402 can comprise a metal, such as those mentioned with respect to electrode layers 44 and 54, or it can be formed of a highly doped semiconductor material. The thicknesses of the various layers of the transistors of the present invention can be tailored to obtain desired electrical properties. The metal electrode layers 44 and 54 should be thick enough to provide for efficient conduction to their associated doped semiconductor layers 46 and 52. For most uses, a thickness of 500 to 3,000 angstroms should be sufficient. The doped layers 46 and 52 need be no thicker than about 500 angstroms, but could be thicker if desired. The thickness of the active semiconductor layer may be from several hundred angstroms, but is preferably greater than 1,000 angstroms, up to a half micron or 1 micron thickness, but may be even thicker. Amorphous silicon alloy semiconductor material can withstand approximately 50 volts per micron without semiconductor breakdown. Accordingly, those in the art will appreciate that when layer 48 is made of such semiconductor material, a substantial voltage may be placed across the anode and cathode when the channel length is one micron or greater. Given the highly conductive nature of the channel in these DIFETs, channel lengths of 5 to 20 microns or more may be utilized.

The thickness of the gate layers of the present invention such as layer 402 may be varied in accordance with the desired operating characteristics of the transistors. Preferably the gate should be thick enough so that its conductivity is sufficient to enable its various parts to maintain a relatively uniform voltage (i.e., to assure there is no appreciable voltage drop within the gate layer itself), as the gate is charged or discharged. If the gate is made of a conductive metal, a thickness of 1,000 angstroms should be sufficient, although the gate may be thicker or thinner. If the gate layer is made of a doped semiconductor material, the gate layer may have to be somewhat thicker. To reduce unnecessary capacitive coupling between the current-carrying electrodes and the gate, the gate should preferably not overlap on these electrodes, although they may do so if desired.

When amorphous semiconductor alloys are used for layers 46, 48 and 52, it is preferable that they contain hydrogen and/or fluorine as density of states reducing elements to improve their semiconductor properties. Since layer 46 is doped to be n type, it has the characteristic of being able to inject many more electrons into the active semiconductor layer than holes. Conversely, since layer 52 is doped to be p-type, it has the ability of inject many more holes into layer 48 and than electrons. Suitable doping levels for layers 46 or 52 are $10^{18}$ to $10^{21}$ atoms $cm^{-3}$.

The method of depositing materials used to form the transistors of the present invention are well known in the art. Amorphous silicon alloys can be deposited in multiple layers over large area substrates to form a multitude of circuits in high volume continuous processing systems. These circuits may be designed to employ many DIFETs. Deposition of the amorphous semiconductor materials, such as alloys of silicon or germanium, is preferably accomplished by glow discharge decomposition of process gases as disclosed, for example, in U.S. Pat. No. 4,226,898 to Stanford R. Ovshinsky, et al. and in U.S. Pat. No. 4,485,389 to Stanford R. Ovshinsky, et al. Among these processes, radio frequency energy glow discharge processes have been found suitable for the continuous production of amorphous semiconductors. Improved processes for making amorphous semiconductor alloys and devices, using microwave energy to decompose the reaction gases to cause the deposition of improved amorphous semiconductor materials, are disclosed in U.S. Pat. Nos. 4,517,223 and 4,515,107. The four patents just mentioned are hereby incorporated herein by reference.

In the various embodiments of the present invention, the gate layers, the doped layers 46 and 52, and their associated conductive layers 44 and 54 may all be patterned using conventional photolithographic techniques to form the desired shapes or openings. Similarly, using conventional integrated circuit fabrication techniques terminal pads (not shown) for each gate, anode and cathode may be provided so as to be able to connect the devices to external circuits or other circuit elements such as transistors, resistors, diodes and the like, so that complex electronic circuit configurations can be created in an integrated fashion on a single substrate. As taught in copending U.S. patent application Ser. No. 821,643 filed Jan. 23, 1986 and entitled "Thin Film Electro-Optical Devices", thin film transistors may be arranged in multiple device planes to form three dimensional integrated circuitry having multiple device planes. This copending patent application is hereby incorporated by reference. As taught therein, optical communication techniques using DIFETs may be used to communicate between various circuit devices in a given plane, or between devices located on different device planes in a three dimensional structure. Several embodiments of the DIFETs of the present invention may be used for such applications.

Figure 9:
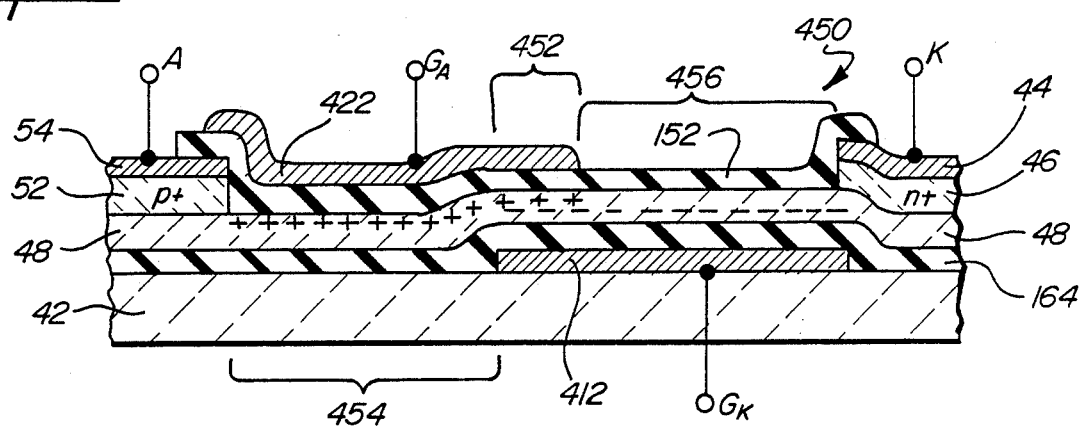
FIG. 9 is a cross-sectional view yet another embodiment of the DIFET of the present invention having dual gates, which may be called the anode gate and cathode gate, each of which extends over a portion of the channel from its respective current-carrying electrode toward the other current-carrying electrode, such that the two gate electrodes overlap one another.

The operation of DIFET 400 in FIG. 9 may now be explained. In operation, an anode-cathode voltage $V_{AK}$ is preferably applied continuously, and the anode-cathode current $I_{AK}$ is modulated by the applied gate bias. When a positive voltage is applied to gate $G_K$, an ambipolar accumulation region dominated by electrons is induced in the portion 406 of the conduction channel in active layer 48 beneath the cathode gate. This dramatically increases the conductivity of portion 406 of the conduction channel, resulting in a larger portion of the voltage $V_{AK}$ being applied across portion 408 of the conduction channel. The increased voltage across portion 408 of the active layer 48 allows higher and more closely balanced ambipolar currents to flow through this region. Since the Portion 408 of the current path across layer 48 includes generous quantities of both types of charge carriers, that is, electrons traveling from the conduction channel under portion 406 and holes from the p+ layer 52, its conductivity will equal or be considerably higher than a similar current path portion in a unipolar FET, especially in those unipolar FETs where the source drain voltage $V_{DS}$ is greater than the applied gate voltage $V_G$.

When the length of channel portion 408 is fairly long (above 1 or 2 microns for amorphous silicon alloys, for example), the ratio between the "on" to "off" currents in DIFET 400 is dependent on the ratio of the overall channel length between the anode and cathode to the length of channel portion 406. The actual amount of current which flows depends upon a number of factors including: the rate of injection of carriers at both the anode and cathode; the conductivity of both channel portions 406 and 408 of layer 48, which increases with increasing anode-cathode voltage on account of the increasing numbers of mobile charge carriers of both polarities and the voltage applied across channel portion 408 when channel portion 406 is rendered highly conductive. It is expected that the on-off current ratio of DIFET 400 will be at least several times greater than the ratio of overall current channel length to the length of portion 408. When the length of channel portion 408 is sufficiently small (one micron, or a few tenths of a micron or less, in amorphous silicon alloy devices for example), it allows carrier injection rates to increase superlinearly with increases in anode-cathode voltage, and substantially increased current levels will result.

Figure 7:
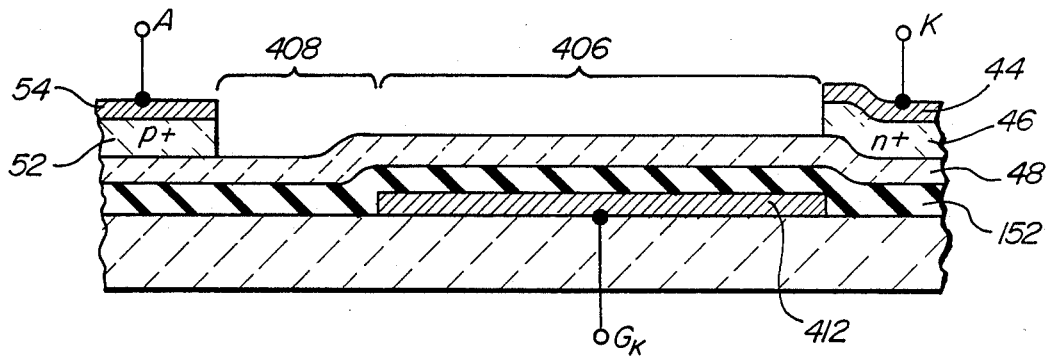
FIG. 7 is a cross-sectiona view of an alternative embodiment of the FIG. 5 device having an inverted gate structure.

FIG. 7 shows another DIFET 410 which operates in the same manner as DIFET 400 of FIG. 6, and differs therefrom only in that it has a inverted gate structure. Inverted gate structures have an advantage when constructing thin film DIFETs, in that the gate insulator 152 may be annealed at relatively high temperatures to improve its dielectric strength and integrity, before the semiconductor layers 48, 46 and 52, which may not be able to take such high temperatures without degrading their electronic properties, are deposited. A number of amorphous silicon alloys, for example, begin to lose some of their desirable electronic properties if exposed to temperatures much above about 200° C.

Figure 8:
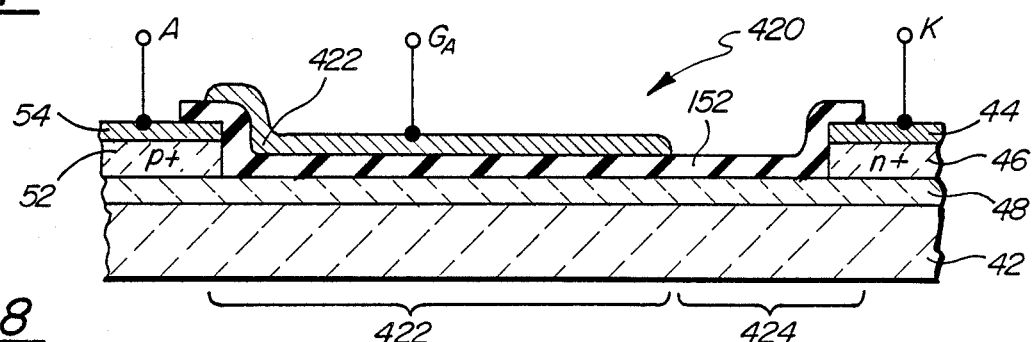
FIG. 8 is a cross-sectional view of another embodiment of the present invention similar to that of FIG. 6, except that the gate, which now may be called the anode gate, extends from the anode across a substantial portion of, but not all of, the channel length.

FIG. 8 shows another embodiment of the present invention similar to that of FIGS. 6 and 7. Instead of having a cathode gate, DIFET 420 shown in FIG. 8 has a anode gate which extends over a major portion 422 of the conduction channel from the anode toward the cathode, but does not cover the portion 424 of the conduction channel closest to the cathode. Those in the art will appreciate that the FIG. 8 device could readily be built using an inverted gate structure, by modifying the DIFET 420 shown in FIG. 8 in the same manner that DIFET 400 of FIG. 6 was modified to obtain the DIFET 410 in FIG. 7.

DIFETs 400 and 410 are particularly suited for use as an n-channel double injection FET, i.e., a DIFET where the active semiconductor layer 48 is naturally slightly n type or has been doped to be lightly h type. Similarly, DIFET 420 is particularly suited for use as a p-channel DIFET, that is a DIFET where the active semiconductor layer 48 is naturally slightly p type or has been doped to be lightly p type. Since the preferred majority carriers in a n type FET are electrons, and in a p type FET are holes, the greatest currents will be realized by biasing a cathode gate so as to attract electrons and by biasing an anode gate so as to attract holes. By applying gate voltages in this manner to DIFETs 400, 410 and 420, the gate induced fields will tend to assist rather than oppose the naturally occurring polarities of the net space charge in these devices. By operating in this manner, the on currents of these DIFETs will be maximized.

The DIFETs 400, 410, and 420 of FIGS. 6 through 8 are particularly desirable for use with semiconductor materials which have high or relatively high electron and/or hole mobilities. Monocrystalline silicon and gallium arsenide are examples of two semiconductors having high mobilities. Those skilled in the crystalline art could readily implement the devices of FIGS. 6 through 8 without undue effort. Also, FIGS. 41A through 42A and the associated text of our copending U.S. patent application Ser. No. 788,594 filed Oct. 17, 1985 show and describe how to make crystalline DIFET structures, and the crystalline construction techniques therein disclosed could be readily adapted to make crystalline DIFET structures corresponding to the DIFETs of the present invention. In DIFETs 400, 410 and 420 where relatively high or high mobility semiconductor material is used for active layer 48, the current-carrying capacity of the portions 408 or 424 of the conduction channel which do not overlap the gate electrode is expected to be high enough so as to not present a significant current limitation. In particular, those in the art should appreciate that the ambipolar devices of the present invention shown in FIGS. 6 through 8 are still expected to feature electrons and holes over the length of the conduction channel between the accumulation regions near the anode and cathode, and thus will benefit from the increased conductance made possible by dual carrier current flow. Also, the conductance in that portions 408 or 424 of the conduction channel will be increased several times on account of the enhancement made possible by the exerted gate field. Accordingly, the DIFETs of FIGS. 6 through 8 will still feature substantially more current-carrying capacity than transistors without such an enhanced conducting channel portion.

FIG. 9 shows yet another DIFET embodiment of the present invention which has two gates, and is a four terminal device. The DIFET 450 in FIG. 9 includes a cathode gate $G_K$ comprised of highly conductive layer 412, an insulating gate layer over the cathode gate, an active semiconductor layer 48 over cathode gate insulator 164, an anode composed of p type doped layer 52 and conductive layer 54, a cathode K composed of n type doped layer 46 and conductive layer 44, a second gate insulating layer 152, and an anode gate $G_A$ composed of highly conductive layer 422, all of the foregoing components of DIFET 450 being arranged in the general fashion shown in FIG. 9. The cathode layer 412 horizontally extends from the cathode K toward the anode, but is spaced from anode, while the anode gate layer 422 horizontally extends from the anode toward the cathode, but is spaced from the cathode. The two gates may be arranged so that they horizontally overlap by some small distance 452. The distance 452 in this overlap of portion of layer 48 may range from zero angstroms to about several microns, but preferably is in the range of 200 angstroms to one micron.

To operate DIFET 450, the anode is positively biased with respect to the cathode by some voltage $V_{AK}$. If the two gates are allowed to float, the current through the DIFET will be relatively small, and will be determined substantially as a function of the conductance of active layer 48 with respect to the unenhanced ambipolar current flowing therethrough. To turn the DIFET 450 on, a voltage less than the anode voltage, and preferably equal to or greater than the cathode voltage is applied to the anode gate $G_A$, while a voltage higher than the cathode voltage, and preferably equal to or lower than the anode voltage is applied to the cathode gate $G_K$. The relatively negative voltage on anode gate $G_A$ attracts holes from the anode, thus producing a "hole-dominated" conduction channel in horizontal portions 454 and 452 of the layer 48 adjacent to insulator 152 composed of an accumulation of holes, while the positive voltage applied to gate $G_A$ induces in horizontal portions 452 and 456 of the layer 48 an "electron-dominated" conduction channel composed of an accumulation of electrons adjacent to the insulator 164. In the overlap portion 452, there is a large concentration of electrons adjacent to insulator 164, and a large concentration of holes adjacent insulator layer 152. In the portion 452 of layer 48, due to the presence of two types of conduction channels, one which tends to have more holes than electrons and the other which tends to have more electrons than holes, a substantial amount of recombination of holes and electrons will occur.

One advantage of having a separate anode and cathode gate as shown in FIG. 9 is that electrons are efficiently injected by the cathode, and holes are efficiently injected by the anode, and the dual gates, when properly biased, maintain this relationship when the transistor is turned on. Accordingly, it is expected that the DIFET 450 may exhibit larger on currents than a DIFET having a single gate which covers all or substantially all the entire length of the conduction channel between anode and cathode.

It should be appreciated that the respective lengths of the anode gate and cathode gate may be adjusted to maximize on current. For example, if the active layer 48 is lightly doped n type, it is desirable to have the anode gate cover a smaller portion, such as one quarter of the channel length, while the cathode gate covers the larger portion of the channel length, in order to exploit the tendency of an n type active layer to favor current which is primarily comprised of mobile electrons. Similarly, if the semiconductor material used for layer 48 is slightly p type, between the anode and cathode, it is desirable to have the anode gate extend from the anode over a major portion such as approximately three quarters of the overall channel length, while the cathode gate length would be extended over most or all of the remaining portion of the channel length such as about one quarter of the channel length. In such fashion, the arrangements of the cathode and anode gate can be tailored by design or by simple experimentation to provide the maximum on current.

As previously mentioned, layer 48 may be several hundred angstroms thick to one micron or more thick. In the FIG. 9 embodiment, it is important to not exceed the breakdown voltage of layer 48 or the breakdown voltage of the insulator layers 152 or 164 by the combination of voltages applied to the gate electrodes 412 and 422.

Figure 10:
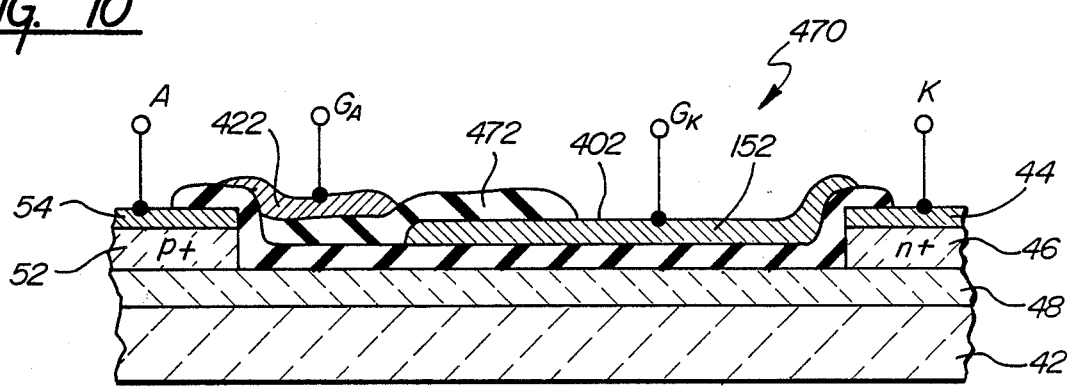
FIG. 10 is a cross-sectional view of another embodiment of the DIFET shown in FIG. 9 having an anode gate and a cathode gate located above the conduction channel.

FIG. 10 shows another dual gate embodiment of the DIFET of the present invention. In this embodiment the anode gate and cathode gate are both located on the upper side of the active layer 48. This allows the layer 48 to be as flat as the underlying surface upon which it rests, which may be desirable in certain electro-optical applications of the DIFET, such as those where layer 48 is being used as an optical conduit between adjacent DIFETs. Such applications are shown in copending patent application Ser. No. 821,643 filed Jan, 23, 1986 and entitled "Thin Film Electro-optical Devices". Once again the voltage difference between the anode gate $G_A$ and the cathode gate $G_K$ must not exceed the breakdown voltage of insulator layer 472.

Figure 11:
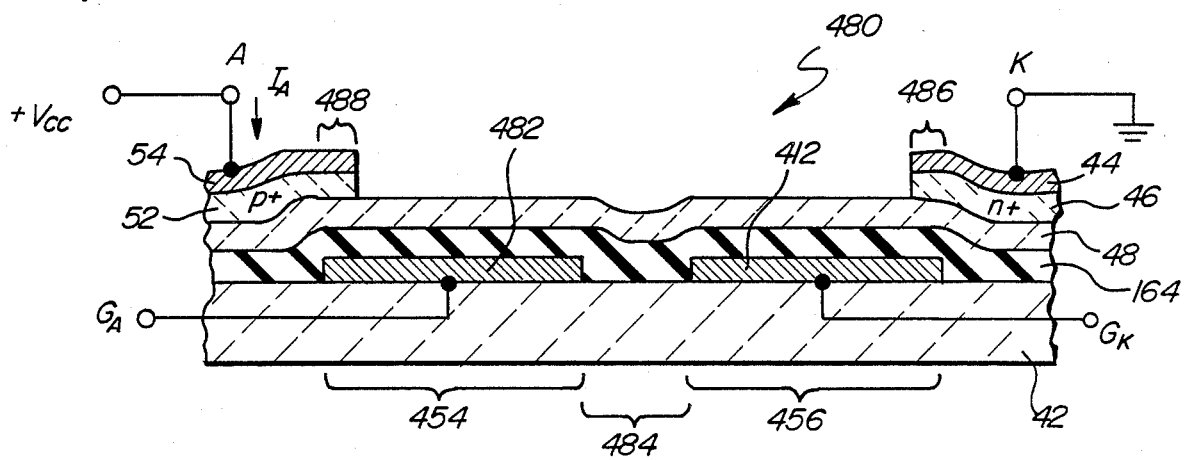
FIG. 11 is a cross-sectional view of another embodiment of the present invention having dual gates located below the conduction channel, with each gate electrode extending from its respective current-carrying electrode toward the other gate electrode but not contacting the other gate electrode.

FIG. 11 shows another four terminal DIFET 480 of the present invention. In this embodiment, the anode gate and cathode gate are shown both located on the lower side of the active semiconductor layer 48, and more importantly, are spaced apart from one another by a horizontal distance 484 whose size should not be so small as to allow punch-through or tunneling through insulator 164 on account of the differences in voltages applied to the anode gate $G_K$. DIFET 480 includes an arrangement of its anode and cathode like that shown in the FIG. 6 DIFET. DIFET 470 of FIG. 10 and DIFET 480 of FIG. 11 may be operated by applying the same kinds of voltages to the anode gate and cathode gate as were described with respect to the DIFET 450 in FIG. 9.

Figure 13:
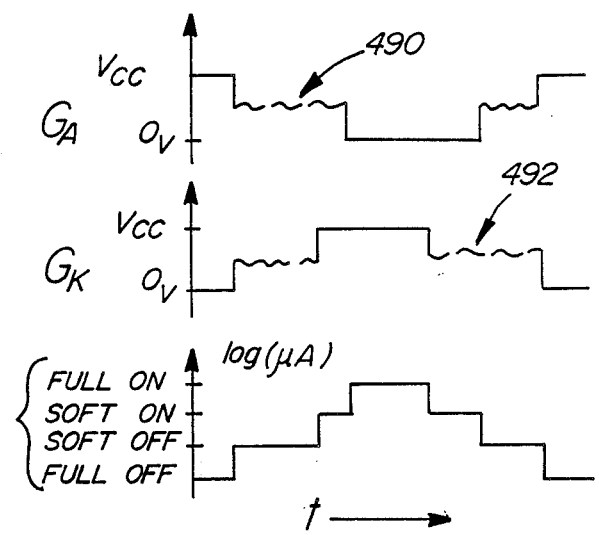
FIG. 13 is a timing diagram illustrating another way of operating the dual gate DIFETs of FIGS. 9, 10 and 11.
Figure 14:
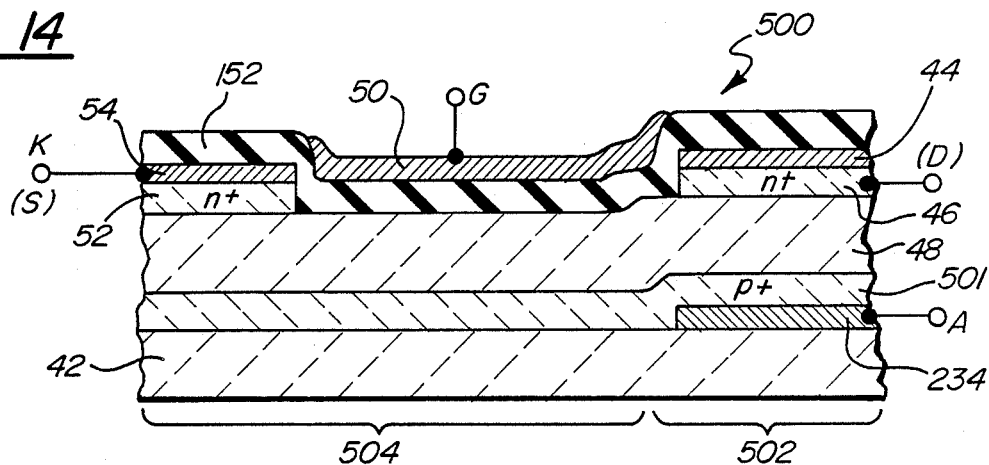
FIG. 14 is a partial cross-sectional view of yet another embodiment of the DIFET of the present invention having four terminals and constructed with a plurality of continuously deposited layers of different conductivity-type semiconductors, for high quality interfaces between semiconductor layers.

Those in the art should appreciate that the FIG. 11 device may also be constructed so that both gates would be located above the active layer 48, in a manner somewhat similar to that of the device shown in FIG. 13, but without the overlapping gate electrodes. Also, the anode gate layer 482 and the cathode gate layer 412 of FIG. 14 are shown slightly overlapping their respective current-carrying electrodes. Such overlapped portions 488 and 486 may increase the capacitance between the respective gates and their current-carrying electrodes, it may also serve to improve the efficiency with which the electrode is able to inject its charge carriers into layer 48. If, for example, it is determined that electrons are much more efficiently injected into the layer 48 than are holes, the amount of overlap between anode gate layer 412 and n type injecting layer 46 may be reduced or eliminated, while the amount of overlap 488 may be increased. When this is done, fewer electrons will be injected, while more holes will be injected, leading to greater balancing of the carriers within the intrinsic layer 48.

As in the FIG. 9 device, the majority of the recombination between holes and electrons may is expected to occur in central portion 484 of the conduction channel. The expected net effect of operating the DIFET 480 by applying a relatively high anode-cathode voltage $V_{AK}$ and by applying a negative voltage to the anode gate $G_A$ and a positive voltage to the cathode gate $G_K$ is to create a forward biased p-i-n diode having a effective channel length approximately equal to the length of central channel portion 484, since a surfeit of electrons will be present in the conduction channel portion 456 adjacent the insulating layer 164, while a surfeit of holes will be present in the conduction channel portion 454 adjacent the insulating layer 164. Given the highly conductive nature of the conductive channel portions 454 and 456, most of the anode-cathode voltage will be available to drive free electrons and holes into the central conduction portion 484, where most are expected to recombine.

Figure 1:
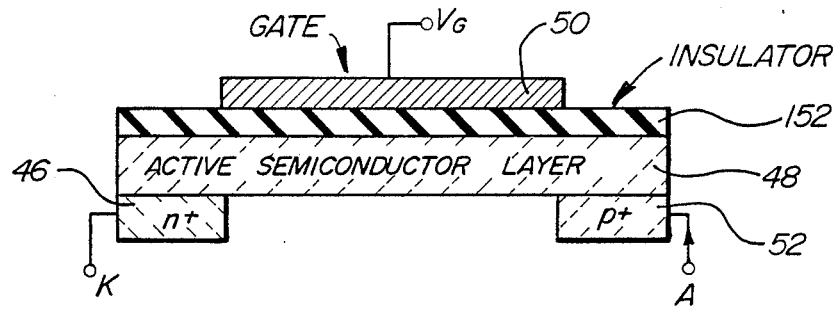
FIG. 1 is a schematic cross-sectional view of one embodiment of the a double injection field effect transistor (DIFET).
Figure 2:
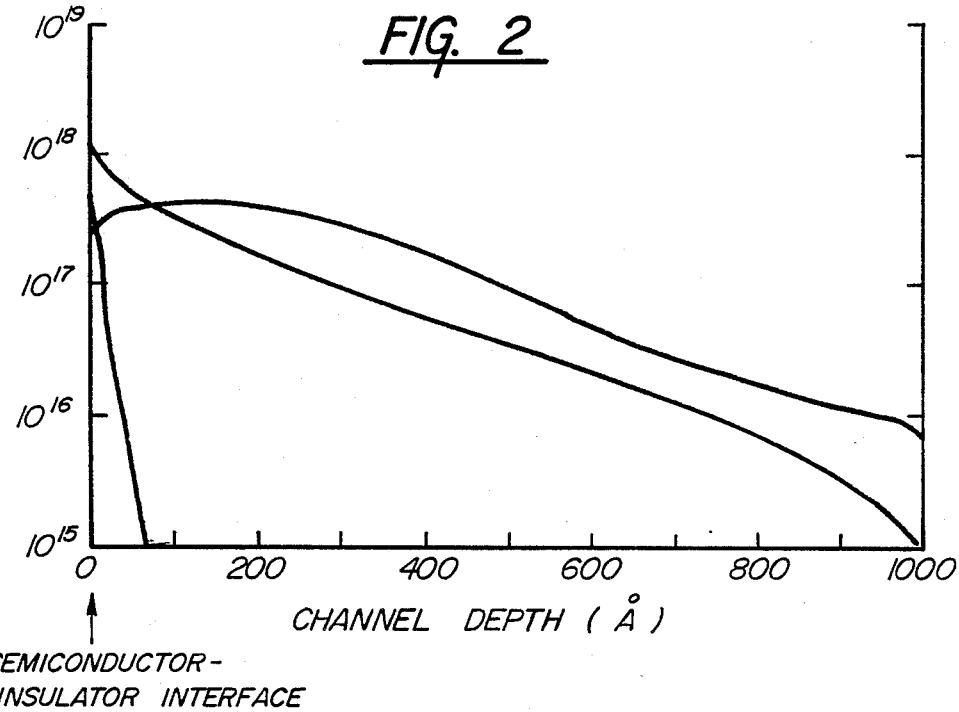
FIG. 2 is a graph showing a computer simulation of mobile carrier concentration across the channel of an amorphous silicon alloy DIFET and a conventional amorphous silicon FET.
Figure 3:
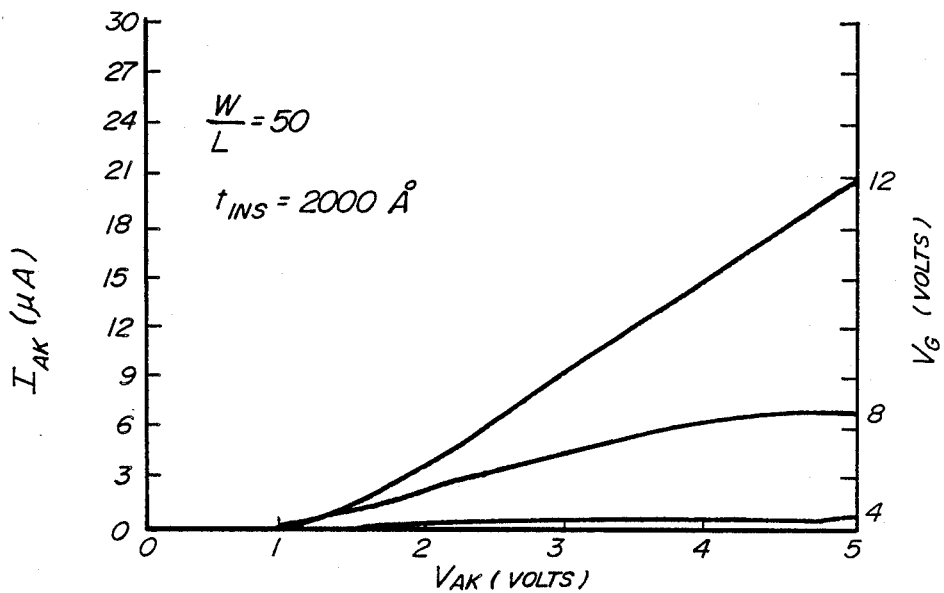
FIG. 3 is the low voltage current-voltage characteristics of one amorphous silicon alloy DIFET.
Figure 4A:
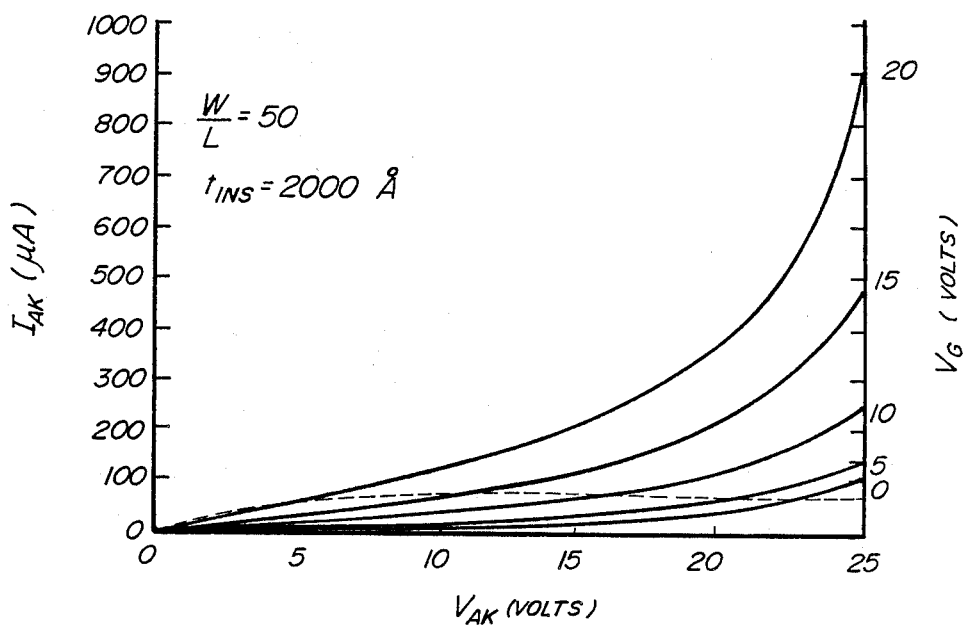
FIG. 4A is the anode-cathode characteristics of one amorphous silicon alloy DIFET as a function of anode-cathode voltage, with the conventional FET source-drain characteristics included as a dashed line for comparison.
Figure 4B:
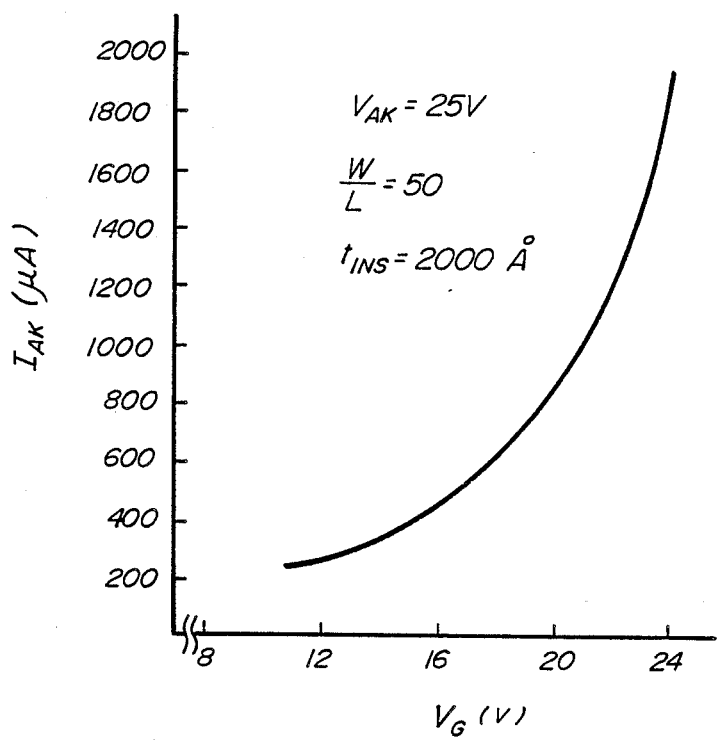
FIG. 4B is the anode-cathode characteristics of an amorphous silicon alloy DIFET as a function of gate voltage.

In the DIFETs of FIG. 1 and the other figures of the present disclosure, and in the DIFETs disclosed in our aforementioned copending applications, it generally is useful to attempt to balance the number of positive charges and negative charges being injected to allow the electric field exerted by the charge on the gate to extend as far as possible into the layer 48, thereby increasing the conductivity of the DIFET. It is known, for example, that it is much easier to inject electrons into layer 48 when it is made of a-Si:H than it is to inject holes. If the effective area of n type doped layer 46 and p type doped layer 52 are equal to one another, then the p+ layer 52 may be made more heavily doped than the n type layer 46 to compensate for the fact it is harder to inject holes than electrons. However, since the mobility of electrons is greater than that of holes in most semiconductors, it is preferable to use, where possible, electrons as the dominant charge carriers in an ambipolar conduction path to achieve the maximum amount of current-carrying capability.

Figure 12:
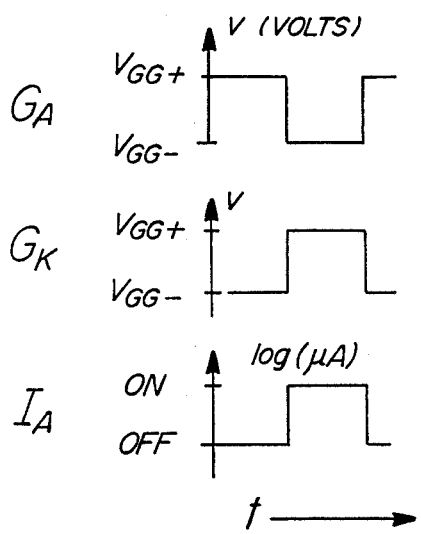
FIG. 12 is a timing diagram illustrating one technique for operating the dual gate DIFETs of FIGS. 9, 10 and 11.
Figure 15:
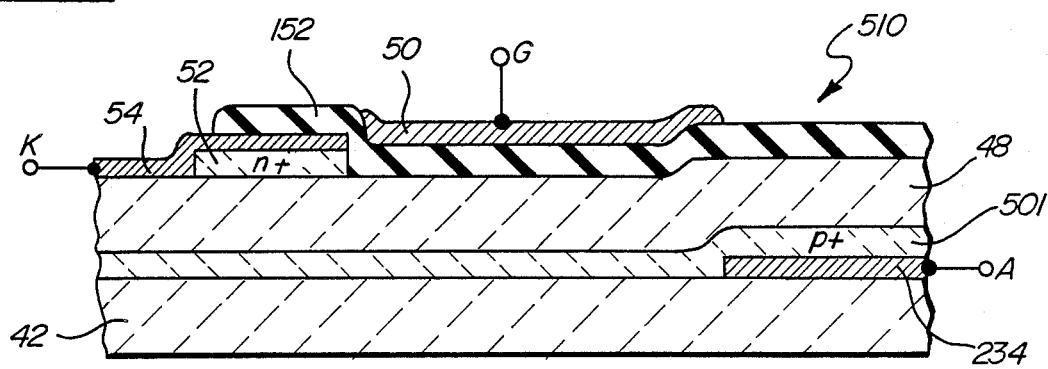
FIG. 15 is a three-terminal version of the FIG. 17 DIFET.

FIGS. 12 and 13 are timing diagrams which help illustrate techniques for operating the dual gate DIFETs shown and described with respect to FIGS. 9 through 11 above. The timing diagram of FIG. 15 shows how the various voltages may be applied to the anode and cathode gates $G_A$ and $G_K$ to turn the DIFETs 450, 470 and 480 off as well as on. In particular, FIG. 12 shows that to turn on these DIFETs, the anode gate voltage is lowered, while the cathode gate voltage is raised. To turn the devices off hard, that is to ensure low off currents, the anode voltage may be raised so that it exceeds the normal anode voltage, while the cathode gate voltage may be lowered so that it is lower than the voltage applied to the cathode. The highest gate voltage $V_{GG+}$ may be made equal to the voltage applied to the anode while the lowest gate voltage $V_{GG-}$ may be made equal to the voltage applied to the cathode to reduce the number of voltages which must be supplied to operate the device, if desired. Instead of biasing the anode and cathode gates to a specific potential to turn the dual gate DIFETs off, the gates may alternatively be allowed to float, when the device is turned off.

FIG. 13 shows the expected operating characteristics of the DIFET 480 in FIG. 11 when the cathode is grounded and the anode voltage is set at $+V_{CC}$ volts, and the anode and cathode gates $G_A$ and $G_K$ are switched between $+V_{CC}$, a floating condition, and zero volts. The dashed wavy lines indicated by reference numerals 490 and 492 respectively represent the situations which are expected to occur when the anode gate and the cathode gate are allowed to float. For this range of operating voltages, when the anode gate is at $+V_{CC}$ volts and the cathode gate is at zero volts, the DIFET 480 is considered to be fully off, that is to be in its minimum leakage current state. This may be understood by noting that when the anode gate is at $+V_{CC}$ volts, the field in the direction of the length of channel portion 454 near the interface between the anode and layer 48, is reduced considerably. Similarly, by placing the cathode gate at zero volts, the field across the cathode layer 48 interface is also reduced. Most of the anode-cathode voltage drop will occur across central conductive portion 484. Accordingly, the number of holes which may be expected to be injected across the p+ layer 48 interface, and the number of electrons which may be expected to be injected across the n+ layer 48 interface, will both be substantially reduced, thus resulting in a low off current. When both gates are allowed to float, a continuous voltage gradient is applied across the length of the channel applied from anode to cathode on account of the anode-cathode voltage. In this condition, the current may be expected to be somewhat higher, which is called a "soft off" condition in FIG. 13. When the cathode gate is set to $V_{CC}$ volts, conduction channel portion 456 is on, thus increasing the current significantly. This condition is called "soft on" in FIG. 13. When the anode gate is set to zero volts, a full on current results. Allowing the cathode gate to float results in a "soft on" current condition since only conduction channel portion 454 is in a highly conductive state. From the foregoing, it may be seen that the DIFET 480 may be switched between four current levels by controlling the bi-state voltages applied to the anode and cathode gates.

Turning now to FIG. 14, a DIFET 500 of the present invention is shown. This DIFET is a four terminal device, and it has some resemblence to the DIFET shown in FIGS. 36 and 37 of our copending U.S. patent application Ser. No. 788,594, in that it is a four terminal device which on one side of the active semiconductor layer 48 appears to be a typical unipolar MOSFET. However, the device is a DIFET on account of the p type doped layer 501 which (like layer 236 in FIGS. 36 and 37) acts as the anode of the device, and supplies holes to active layer 48 of the device. However, unlike layer 236, layer 501 extends all the way across the length and width of the channel.

To fabricate DIFET 500, a continuous layer of highly conductive material, such as a metal like molybdenum, aluminum or chrome is deposited and then patterned using known techniques to form highly conductive portion 234 of anode A. Thereafter, a thin layer of semiconductor material is deposited to form layer 501. The portion 502 of layer 501 which is adjacent the conductive layer 234 forms part of the anode. The portion 504 of layer 501 which is non-adjacent to the conductive layer 234 may or may not form a part of the anode A as will be explained shortly. Thereafter, layer 48, which may be lightly doped or intrinsic, is deposited followed by the successive deposition of a n type doped layer and a highly conductive layer, which are subsequently patterned using known photolithographic techniques to form cathode K composed of conductive layer 54 and n type doped layer 52 and to form at the same time the drain electrode comprised of conductive layer 44 and n type doped layer 46. Next, a insulating layer 152, which may be formed of any conventional or suitable insulator, such as silicon oxide $S_xO_y$, or silicon nitride $Si_xN_y$, is deposited, followed by the deposition of a highly conductive layer deposited upon the insulating layer, which may be patterned as shown to form gate 50.

Layer 236 is preferably made so thin, i.e., 200 angstroms to 500 angstroms thick, that its conductance in the vertical direction is great while its conductance in the horizontal direction along the length of the channel is a few or more orders of magnitude less In this manner the lateral resistance of the layer 236 be very substantial, and accordingly layer 236 does not act as a horizontal shunt of layer 48, which would detrimentally provide a high leakage current between anode and cathode, resulting in a poor on-off current ratio in DIFET 500.

If desired, layer 501 can be deposited so as to form a microcrystalline p type doped layer. Such a p doped microcrystalline layer may be made using the techniques disclosed in copending U.S. patent application Ser. No. 701,320 filed Feb. 13, 1985 and entitled "Improved P-Doped Semiconductor Alloy Material and Devices Fabricated Therefrom." This patent application is hereby incorporated herein by reference. It is known in the art and predicted by percolation theory that even though the vertical resistivity of a microcrystalline layer is very low its lateral resistivity can be very high, since there are very few substantially continuous current paths through the microcrystallites in such a layer to provide for any appreciable current flow. To avoid having layer 501 act as a shunt, it is preferably to use such a high lateral resistivity material to construct the layer.

The fabrication steps of DIFET 500 are very advantageous, in that no intervening processing of the semiconductor layers occurs during the deposition of layers 236, 48, the topmost doped layer from which portions 46 and 52 are formed, and the evaporation of the metal layer from which electrode portions 44 and 54 are formed. Accordingly, this helps to ensure the formation of clean interfaces between these semiconductor layers, and greatly reduce the likelihood of poor carrier injection between the layers which might possibly result if contaminants were introduced at the interfaces or undesired interface states created by intervening processing steps, which retard of impede carrier injection. Also, by not having to photolithographically define and form layer 236 to correspond in size to the conductive portion 234 of the anode A, the number of processing steps is reduced, thereby helping to simplify device construction and possibly improve yield.

The p type and n type layers could be interchanged in the FIG. 14, so as to result in a device having two p type doped layers above layer 48, and a n type doped layer below layer 48. In such an embodiment, the n type doped layer would preferably be made from n type microcrystalline semiconductor material.

FIG. 15 is another DIFET 510 of the present invention formed utilizing the continuous processing techniques disclosed with respect to the DIFET of FIG. 14. The only difference between FIG. 14 device and FIG. 15 device is that the second current-carrying electrode having a n type semiconductor layer, that is drain D, has been omitted, thereby resulting in a three terminal device.

Another advantage of the FIG. 14 device is the fact that the effective hole-injecting portion 502 of the p+ layer 501 may be made larger in cross-sectional interface area than the n+ layer portion 52 of the cathode K, as is shown, to provide for increased hole injection, since holes are more difficult to inject than are electrons in most semiconductor materials such as intrinsic a-Si:H.

Another advantage of using a microcrystalline layer as p type (or n type) semiconductor layer 501 is that its band gap is greater than the band gap between a p type doped semiconductor layer and layer 48, thus leading to increased hole injection, which should also lead to better carrier balancing. Those skilled in the art should appreciate that in all other embodiments of the DIFETs disclosed herein and our copending U.S. patent application Ser. No. 788,594, microcrystalline doped layers may also be used, for heavily doped current-carrying layers such as layers 46, 52, and 236, if desired.

Figure 16A:
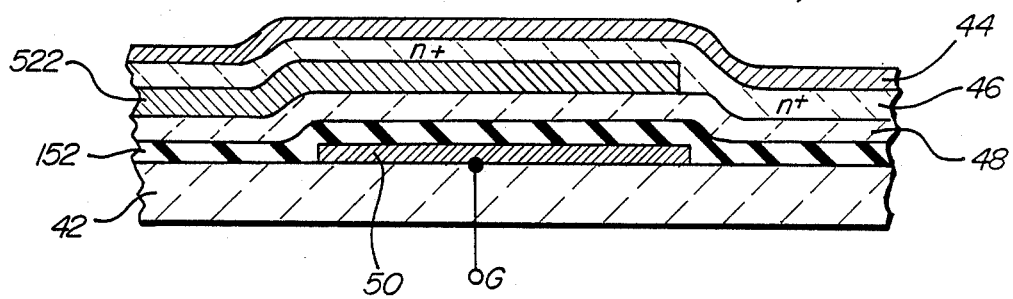
FIGS. 16A through 16C are cross-sectional views of partially formed DIFETs illustrating two different techniques for forming the DIFET of FIG. 17.
Figure 16B:
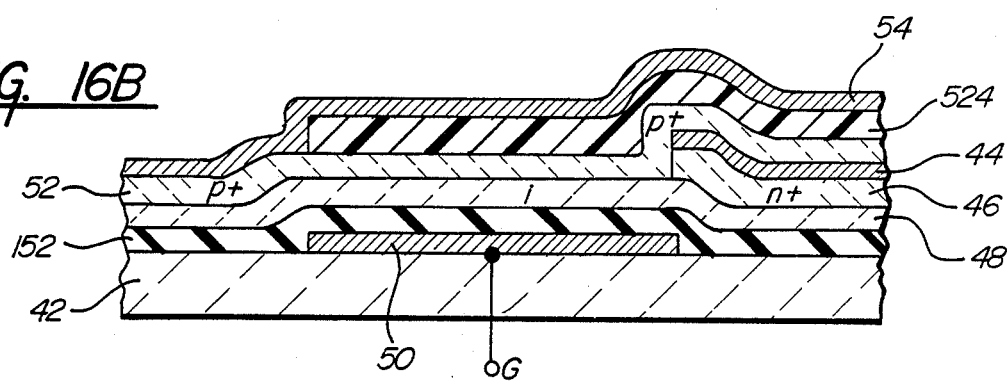

Turning to FIG. 16A there is shown a partially formed DIFET structure 520 which can be subsequently patterned in the manner which will now be described, to form a DIFET 170 of the type shown in FIG. 17. DIFET 170 has the same general configuration or layout as DIFET 170 disclosed in FIG. 31 of our copending U.S. patent application Ser. No. 788,594, therein about the materials used for the thicknesses of the various layers are applicable to DIFET 170 herein. By fabricating the DIFET of FIG. 17 in the manner to be described with respect to FIGS. 16A, 16B and 16C, adverse etching of the deposited semiconductor layer 48 can be avoided, thereby reducing the possibility of contamination or creation of interface states which might tend to impede device performance such as reducing injection of charge carriers into the active layer 48.

The partial DIFET structure 520 is formed by depositing and patterning the bottom highly conductive layer, which is preferably a metal, to form gate layer 50, and then depositing the gate insulating layer 50. Thereafter, the active semiconductor layer 48 is deposited, followed by the forming of a highly conductive layer, preferably a metal such of patterned metal layer 522. This patterned layer 522 can be formed by depositing a metal, preferably aluminum, all over layer 48, followed by a layer of photoresist, which is then exposed and developed in order to pattern layer 522 as shown. Preferably, however, patterned layer 522 is formed as follows. A layer of photoresist is deposited continuously over active layer 48, followed by exposure and development, and then the deposition of aluminum over the entire structure, followed by conventional photoresist lift-off of aluminum from the areas where it is not desired, thus leaving patterned aluminum layer 522.

After patterned layer 522 has been formed, a n type doped layer 46 may be deposited, such as by glow discharge, followed by the deposition of electrode metal, such as molybdenum or chrome over the n+ layer 46, by evaporation or low power magnetron sputtering of the metal. At this point, the multilayer structure 520 looks as shown in FIG. 16A. Next, the aluminum layer 522 is stripped away and with it the unwanted portions of n+ layer 46 and metal layer 44, by use of an appropriate metal etchant, such as a mixture of equal parts of hydrochloric acid and de-ionized water. The metal etchant should be selected so that it will not significantly degrade the surface of the amorphous silicon layer 48 below the patterned aluminum layer 522.

To form the cathode, a layer of p type doped semiconductor and conductive electrode layer must be deposited and patterned. This can be done in one of two ways. As shown in FIG. 16B, a p+ layer may be deposited over the entire partial structure, followed by the application, exposure and development of a photoresist layer 524 to pattern it as shown, which is then covered completely with a metal layer to form continuous layer 54. Then using a photoresist lift-off technique the unwanted portions of layer 54 are removed, and the unwanted portions of the p+ layer may be removed by creative ion etching, using the pattern conductive electrode portions 54 and 46 which remain as a mask. Suitable reactive ion etching techniques for this purpose, for example, are taught in copending U.S. patent application Ser. No. 851,756 filed Apr. 14, 1986 and entitled "Method Of Forming Thin Film Semiconductor Devices". This application is hereby incorporated herein by reference.

Figure 16C:
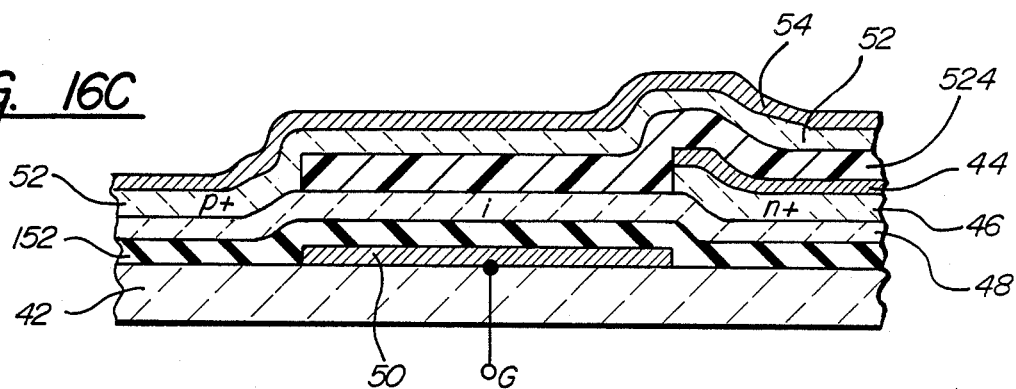
Figure 17:
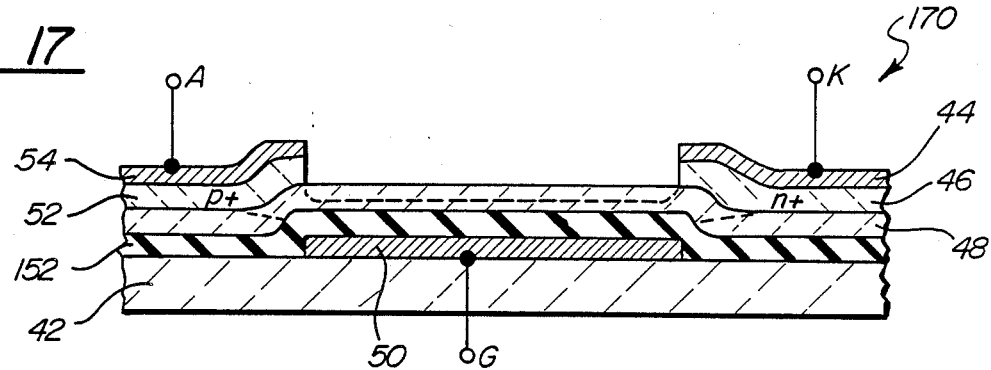
FIG. 17 is a DIFET made in accordance with the methods illustrated in FIG. 16.

Alternatively, as indicated in FIG. 16C, the photoresist layer 524 could be first applied, exposed and patterned, followed by the deposition of the p type doped layer 52 and then metal layer 54 continuously thereover. Then, the unwanted portions of the p+ layer 52 and 54 could be removed via photoresist lift-off, leaving the patterned layers 52 and 54 which form the anode of DIFET 530 in FIG. 20.

It is to be noted that the term "amorphous", as used herein, includes all materials or alloys which have long range disorder, although they may have short or intermediate range order or even contain, at times, crystalline inclusions. Also, as used herein, the term "microcrystalline" is defined as a unique class of said amorphous materials characterized by a volume fraction of crystalline inclusions, said volume fraction of inclusions being greater than a threshold value at which the onset of substantial changes in certain key parameters such as electrical conductivity, band gap and absorption constantly occur.

As can be appreciated by those skilled in the art, the present invention can be practiced otherwise then as specifically disclosed herein. For example, those skilled in the art will readily be able to design and construct additional DIFET and VMIT structures, including variations of those shown in our copending patent applications, using logical and straight forward combinations of selected features from the various embodiments of the present invention. Therefore, it is to be understood that within the scope of the appended claims, our invention can be practiced otherwise than has been specifically described above.

We claim:
1. A method of forming a thin film electronic device comprising the steps of:
   forming a conductive gate on an insulating substrate;
   forming an insulating layer over said gate;
   depositing a layer of substantially intrinsic noncrystalline semiconductor material over said insulating layer;
   forming a layer of etchable metal over said noncrystalline layer and patterning said metal, said metal being etchable by an etchant which does not readily adversely affect the electronic properties of said layer during etching;
   depositing a first layer of doped noncrystalline semiconductor material over said patterned metal layer;
   removing said metal layer by etching, and at the same time, removing that portion of said first doped layer which overlies said etchable metal layer.

2. A method as defined in claim 1 further comprising the step of: depositing a second doped layer after removing said etchable metal layer.

* * * * *